US012598961B2

(12) United States Patent
Kim

(10) Patent No.: US 12,598,961 B2
(45) Date of Patent: Apr. 7, 2026

(54) SEMICONDUCTOR PACKAGE INCLUDING TEST PATTERN AND METHOD OF FABRICATING THE SAME

(71) Applicant: SAMSUNG ELECTRONICS CO., LTD., Suwon-si (KR)

(72) Inventor: Youngbae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/223,790

(22) Filed: Jul. 19, 2023

(65) Prior Publication Data

US 2024/0213104 A1    Jun. 27, 2024

(30) Foreign Application Priority Data

Dec. 23, 2022    (KR) ........................ 10-2022-0182865

(51) Int. Cl.
| *H01L 21/66* | (2006.01) |
| *G01R 31/28* | (2006.01) |
| *H03K 3/03* | (2006.01) |

(52) U.S. Cl.
CPC .......... *H01L 22/34* (2013.01); *G01R 31/2831* (2013.01); *G01R 31/2884* (2013.01); *H03K 3/0315* (2013.01)

(58) Field of Classification Search
CPC ........ G01R 31/2856; G01R 31/318594; G01R 31/318544
See application file for complete search history.

(56) References Cited

U.S. PATENT DOCUMENTS

| 7,642,625 | B2 | 1/2010 | Otsuki | |
| 7,649,376 | B2 | 1/2010 | Tsuchiya | |
| 8,981,543 | B2 * | 3/2015 | Kwon | H01L 23/49816 |
| | | | | 257/680 |
| 10,720,396 | B2 * | 7/2020 | Roh | H01L 23/544 |
| 10,746,787 | B2 | 8/2020 | Pagani | |
| 2008/0157800 | A1 | 7/2008 | Hong | |
| 2009/0189703 | A1 * | 7/2009 | Chuang | H03K 3/0315 |
| | | | | 331/57 |
| 2009/0272974 | A1 * | 11/2009 | Park | G01R 31/31813 |
| | | | | 257/E23.002 |
| 2013/0212414 | A1 * | 8/2013 | Bansal | G06F 30/327 |
| | | | | 713/320 |
| 2014/0103516 | A1 * | 4/2014 | Yeom | H01L 23/49827 |
| | | | | 257/685 |
| 2018/0045781 | A1 * | 2/2018 | Song | G01R 31/318525 |
| 2018/0358332 | A1 * | 12/2018 | Kim | H01L 22/32 |

(Continued)

FOREIGN PATENT DOCUMENTS

| JP | 8-146095 | A | 6/1996 |
| JP | 2007-194530 | A | 8/2007 |
| JP | 2008-311318 | A | 12/2008 |

(Continued)

*Primary Examiner* — Huy Q Phan
*Assistant Examiner* — Temilade S Rhodes-Vivour
(74) *Attorney, Agent, or Firm* — Sughrue Mion, PLLC

(57) ABSTRACT

Provided is a semiconductor package, including a first semiconductor chip, and a second semiconductor chip on the first semiconductor chip, wherein the first semiconductor chip includes a test pattern, and wherein a frequency based on stress being exerted on the first semiconductor chip is measured based on the test pattern.

17 Claims, 10 Drawing Sheets

(56)                    References Cited

U.S. PATENT DOCUMENTS

2020/0135594 A1*    4/2020   Lee ......................... H01L 24/92

FOREIGN PATENT DOCUMENTS

| | | |
|---|---|---|
| JP | 2011-127934 A | 6/2011 |
| KR | 10-0909530 B1 | 7/2009 |
| KR | 10-2019-0041317 A | 4/2019 |
| KR | 10-2022-0016689 A | 2/2022 |

* cited by examiner

SEMICONDUCTOR PACKAGE INCLUDING TEST PATTERN AND METHOD OF FABRICATING THE SAME

CROSS-REFERENCE TO RELATED APPLICATIONS

This application is based on and claims priority to Korean Patent Application No. 10-2022-0182865, filed on Dec. 23, 2022, in the Korean Intellectual Property Office, the disclosure of which is incorporated herein by reference in its entirety.

BACKGROUND

Embodiments of the present disclosure relate to a semiconductor package including a test pattern.

A semiconductor package is configured to more easily use an integrated-circuit chip as a part of an electronic product. In general, the semiconductor package includes a printed circuit board (PCB) and a semiconductor chip, which is mounted on the PCB and is electrically connected to the PCB using bonding wires or bumps. With development of the electronic industry, many studies are being conducted to improve reliability and durability of the semiconductor package.

SUMMARY

One or more embodiments provide a semiconductor package with improved reliability.

According to an aspect of an embodiment, there is provided a semiconductor package, including a first semiconductor chip, and a second semiconductor chip on the first semiconductor chip, wherein the first semiconductor chip includes a test pattern, and wherein the test pattern is configured to be used to measure a frequency based on stress exerted on the first semiconductor chip.

According to another aspect of an embodiment, there is provided a semiconductor package, including a first re-distribution layer, a first semiconductor chip on the first re-distribution layer, the first semiconductor chip including a plurality of test patterns, a second semiconductor chip on the first semiconductor chip, a width of the second semiconductor chip being smaller than a width of the first semiconductor chip in a horizontal direction, and a second re-distribution layer on the second semiconductor chip, wherein the first semiconductor chip is configured to measure a frequency based on stress being exerted on the first semiconductor chip.

According to another aspect of an embodiment, there is provided a semiconductor package, including a first re-distribution layer, a first semiconductor chip on the first re-distribution layer, the first semiconductor chip including a plurality of test patterns, a second semiconductor chip on the first semiconductor chip, a width of the second semiconductor chip being smaller than a width of the first semiconductor chip, a mold layer on the first semiconductor chip and the second semiconductor chip, a mold via penetrating the mold layer, and a second re-distribution layer on the mold layer, wherein each of the plurality of test patterns is configured to be used to measure a frequency that is caused by stress applied to the first semiconductor chip, wherein the first semiconductor chip further includes a penetration via connected to each of the plurality of test patterns, and wherein the plurality of test patterns include a first test pattern adjacent to a corner of the first semiconductor chip, a second test pattern included in a region of an upper portion of the first semiconductor chip overlapping with an end portion of the second semiconductor chip in a vertical direction, and a third test pattern in a central region of the upper portion of the first semiconductor chip.

According to another aspect of an embodiment, there is provided a method of fabricating a semiconductor package, including measuring a first frequency caused by stress applied to a first semiconductor chip, stacking a second semiconductor chip on the first semiconductor chip, and measuring a second frequency caused by stress applied to the first semiconductor chip based on the second semiconductor chip being stacked on a top surface of the first semiconductor chip.

BRIEF DESCRIPTION OF DRAWINGS

The above and other aspects, features, and advantages of the embodiments will be more clearly understood from the following detailed description, taken in conjunction with the accompanying drawings, in which:

FIGS. 4A, 4B, 4C, 4D, and 4E are sectional views illustrating a process of fabricating the semiconductor package of FIG. 2;

DETAILED DESCRIPTION

Example embodiments will now be described more fully with reference to the accompanying drawings, in which example embodiments are shown.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
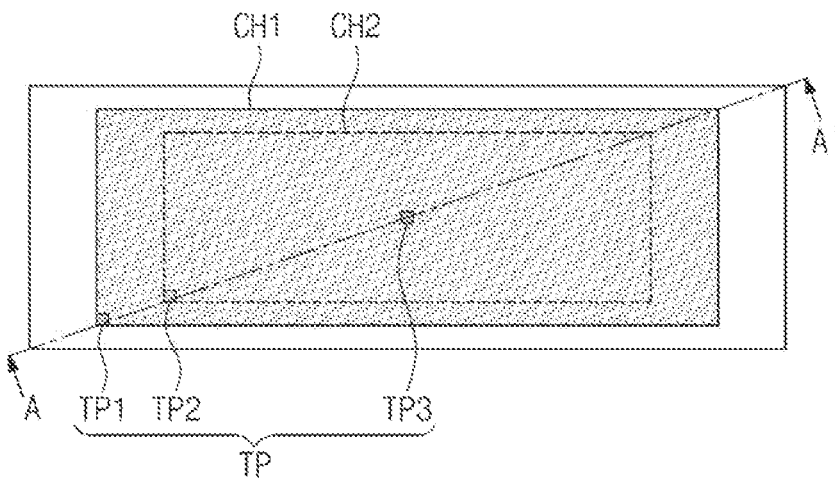
FIG. 1 is a plan view illustrating a semiconductor package according to an embodiment.
Figure 2:
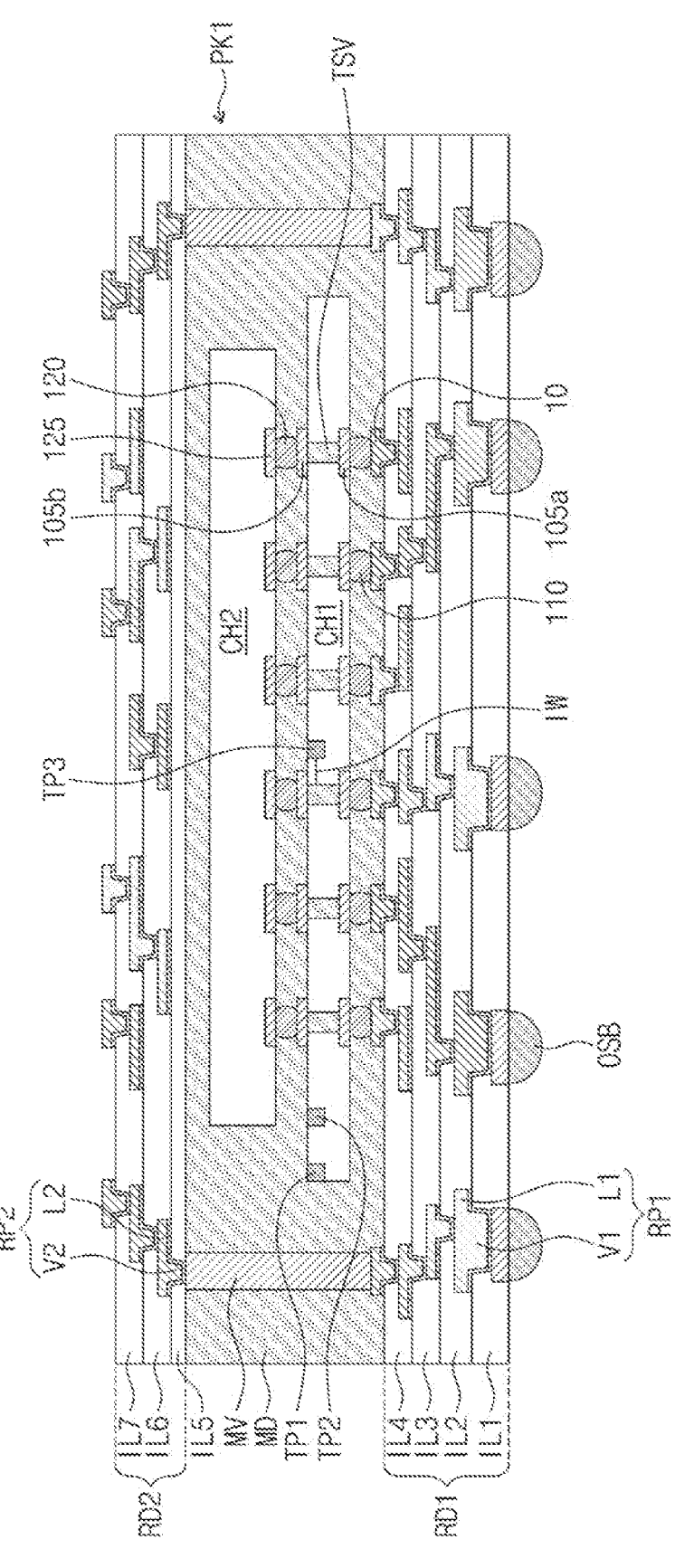
FIG. 2 is a sectional view, which is taken along a line A-A' of FIG. 1 to illustrate a semiconductor package according to an embodiment.

FIG. 1 is a plan view illustrating a semiconductor package according to an embodiment, and FIG. 2 is a sectional view taken along a line A-A' of FIG. 1.

Referring to FIGS. 1 and 2, a semiconductor package PK1 according to an embodiment may include a first semiconductor chip CH1 including test patterns TP, a second semiconductor chip CH2, a mold layer MD, a first re-distribution layer RD1, and a second re-distribution layer RD2.

The first semiconductor chip CH1 may be a logic chip. For example, the first semiconductor chip CH1 may be one of a microelectromechanical system (MEMS) chip or an application-specific integrated circuit (ASIC) chip.

The first semiconductor chip CH1 may be connected to the first re-distribution layer RD1 by first inner connection members 110 in a flip-chip bonding manner. Each of the first inner connection members 110 may electrically connect a first chip pad 105a of the first semiconductor chip CH1 to a substrate conductive pattern 10 of the first re-distribution layer RD1. The first inner connection members 110 may include solder balls, conductive bumps, and/or conductive pillars. The first inner connection members 110 may be formed of or include at least one of tin, lead, silver, copper, nickel, or gold.

The first semiconductor chip CH1 may include the first chip pad 105a included in the first semiconductor chip CH1, a second chip pad 105b disposed on a top surface of the first semiconductor chip CH1, and a penetration via TSV connecting the first chip pad 105a and the second chip pad 105b to each other.

The second semiconductor chip CH2, which is mounted on the first semiconductor chip CH1 in a vertical direction, may be a memory chip.

The second semiconductor chip CH2 may be connected to the first semiconductor chip CH1 through second inner connection members 120. Each of the second inner connection members 120 may electrically connect the second chip pad 105b of the first semiconductor chip CH1 to an inner chip pad 125 of the second semiconductor chip CH2. The second inner connection members 120 may include solder balls, conductive bumps, and/or conductive pillars. The second inner connection members 120 may be formed of or include at least one of tin, lead, silver, copper, nickel, or gold.

The first semiconductor chip CH1 may have a width that is greater than a width of the second semiconductor chip CH2 in a horizontal direction.

The first semiconductor chip CH1 may include the test pattern TP, which is used to measure a frequency according to a stress applied to the first semiconductor chip CH1.

The test pattern TP may be a test electrical group (TEG) pattern.

The test pattern TP may be disposed in an upper portion of the first semiconductor chip CH1, as shown in FIG. 2.

In an embodiment, the first semiconductor chip CH1 may include a plurality of test patterns TP. For example, the test patterns TP may include a first test pattern TP1, a second test pattern TP2, and a third test pattern TP3, however, embodiments are not limited thereto.

The first test pattern TP1 may be disposed adjacent to one of the corners of the first semiconductor chip CH1.

The second test pattern TP2 may be disposed in a region of the upper portion of the first semiconductor chip CH1, which vertically overlaps with an end portion of the second semiconductor chip CH2.

The third test pattern TP3 may be disposed in a center region of the upper portion of the first semiconductor chip CH1.

When the second semiconductor chip CH2 is stacked on the first semiconductor chip CH1 in a subsequent fabrication process, the first test pattern TP1 may measure a physical stress, which is exerted on the one of the corners of the first semiconductor chip CH1, the second test pattern TP2 may measure a physical stress, which is exerted on a portion of the first semiconductor chip CH1 which vertically overlaps with the end portion of the second semiconductor chip CH2, and the third test pattern TP3 may measure a physical stress, which is exerted on the central region of the upper portion of the first semiconductor chip CH1. Similarly, each of the first to third test patterns TP1 to TP3 may measure a physical stress, which is exerted on a corresponding portion of the first semiconductor chip CH1, when the first semiconductor chip CH1, on which the second semiconductor chip CH2 is stacked, is mounted on the first re-distribution layer RD1 in a fabrication process to be described below.

Since each of the first to third test patterns TP1 to TP3 is used to measure a physical stress, which is applied to each portion of the first semiconductor chip CH1 during the fabrication process, it may be possible to more accurately measure a change of frequency, which is caused by the physical stress applied to the first semiconductor chip CH1.

The first to third test patterns TP1 to TP3 may be disposed along a diagonal line connecting opposite corners of the first semiconductor chip CH1 in a plan view, as shown in FIG. 1. The first to third test patterns TP1 to TP3 may be disposed along the diagonal line connecting opposite corners of the first semiconductor chip CH1 but may be spaced apart from each other by specific distances in a region from a first corner of the first semiconductor chip CH1 to a center of the first semiconductor chip CH1. The first semiconductor chip CH1 may be provided to have a first corner and a second corner, which is opposite to the first corner, which are symmetric with respect to the center of the first semiconductor chip CH1. In this case, since it is unnecessary to dispose the test patterns in a region from the center of the first semiconductor chip CH1 to the second corner, the physical stress, which is applied to the first semiconductor chip CH1, may be more efficiently measured.

Each of the first to third test patterns TP1 to TP3 may include a ring oscillator.

The first semiconductor chip CH1 may include an inner wire IW connecting the test pattern TP to the penetration via TSV. The third test pattern TP3 may be connected to the penetration via TSV of the first semiconductor chip CH1 through the inner wire IW, as shown in FIG. 2. Although only the third test pattern TP3 is illustrated to be connected to the penetration via TSV, the first and second test patterns TP1 and TP2 may also be connected to the penetration via TSV of the first semiconductor chip CH1.

The first re-distribution layer RD1 may be disposed below the first semiconductor chip CH1. The first re-distribution layer RD1 may include re-distribution insulating layers IL1, IL2, IL3, and IL4 and a first re-distribution pattern RP1.

A first re-distribution insulating layer IL1 may be formed of or include an insulating polymer or a photoimageable polymer (e.g., photoimageable dielectric (PID) materials). For example, the PID materials may include photoimageable polyimide, polybenzoxazole (PBO), phenol-based polymers, or benzocyclobutene-based polymers.

A plurality of first re-distribution patterns RP1 may be provided. As shown in FIG. 2, each of the first re-distribution patterns RP1 may include a first line portion L1 and a first via portion V1. The first line portion L1 of the first re-distribution pattern RP1 may be disposed in the first re-distribution insulating layer IL1.

According to embodiments, a via portion of a conductive element may be a portion that is used for a vertical interconnection, and a line portion of the conductive element may be a portion that is used for a horizontal interconnection. Here, a width of the line portion may be greater than a width of the via portion in the horizontal direction.

The first line portion L1 may be extended in a direction that is parallel to a top surface of the first re-distribution layer RD1. A width of the first line portion L1 may be greater than a width of the first via portion V1. The first via portion V1 may be disposed below the first line portion L1. The first via portion V1 may have a shape protruding toward a bottom surface of the first re-distribution layer RD1. A width of the uppermost portion of the first via portion V1 may be greater than a width of the lowermost portion of the first via portion V1. The width of the first via portion V1 may decrease toward the bottom surface of the first re-distribution layer RD1. The first re-distribution patterns RP1 may be formed of or include at least one of conductive materials (e.g., copper (Cu), tungsten (W), and titanium (Ti)).

The first re-distribution layer RD1 may further include a second re-distribution insulating layer IL2, a third re-distribution insulating layer IL3, and a fourth re-distribution insulating layer IL4, and each of the second to fourth re-distribution insulating layers IL2 to IL4 may include the first re-distribution patterns RP1, like the first re-distribution insulating layer IL1.

In the embodiment, the first re-distribution layer RD1 is illustrated to include four re-distribution insulating layers (e.g., IL1 to IL4), but embodiments are not limited thereto. For example, the first re-distribution layer RD1 may include three or fewer, or five or more, re-distribution insulating layer, in which the first re-distribution patterns RP1 are provided.

Outer connection terminals OSB may be bonded to bottom surfaces of the lowermost ones of the first re-distribution patterns RP1. The outer connection terminals OSB may be in contact with bottom surfaces of the first line portions L1 of the lowermost ones of the first re-distribution patterns RP1. The outer connection terminals OSB may be formed of or include at least one of conductive materials (e.g., nickel (Ni) and gold (Au)).

The mold layer MD may be disposed on the first re-distribution layer RD1 to cover the first and second semiconductor chips CH1 and CH2. In an embodiment, the mold layer MD may completely cover the first and second semiconductor chips CH1 and CH2. The mold layer MD may be formed of or include at least one of insulating polymers (e.g., epoxy molding compound (EMC)). The mold layer MD may further include fillers, which are distributed in the insulating polymer.

The mold layer MD may be interposed between the first re-distribution layer RD1 and a second re-distribution layer RD2. The mold layer MD may be provided to hermetically seal a space between the top surface of the first re-distribution layer RD1 and a bottom surface of the second re-distribution layer RD2.

The second re-distribution layer RD2 may cover a top surface of the mold layer MD.

The second re-distribution layer RD2 may include a fifth re-distribution insulating layer IL5. The fifth re-distribution insulating layer IL5 may be formed of or include an insulating polymer or a photoimageable polymer (e.g., PID materials). For example, the PID materials may include photoimageable polyimide, polybenzoxazole (PBO), phenol-based polymers, or benzocyclobutene-based polymers.

A plurality of second re-distribution patterns RP2 may be provided. As shown in FIG. 2, each of the second re-distribution patterns RP2 may include a second line portion L2 and a second via portion V2. The second via portion V2 of the second re-distribution pattern RP2 may be disposed in the fifth re-distribution insulating layer IL5.

The second line portion L2 may be extended in a direction parallel to a top surface of the second re-distribution layer RD2. A width of the second line portion L2 may be greater than a width of the second via portion V2 in the horizontal direction. The second via portion V2 may be disposed under the second line portion L2. The second via portion V2 may have a shape protruding toward the bottom surface of the second re-distribution layer RD2. A lowermost width of the second via portion V2 may be smaller than an uppermost width of the second via portion V2. The second re-distribution pattern RP2 may be formed of or include at least one of conductive materials (e.g., copper (Cu), tungsten (W), and titanium (Ti)).

The second re-distribution layer RD2 may further include a sixth re-distribution insulating layer IL6 and a seventh re-distribution insulating layer IL7, and each of the sixth and seventh re-distribution insulating layers IL6 and IL7 may include the second re-distribution patterns RP2, similar to the fifth re-distribution insulating layer IL5.

In the embodiment, an example, in which three second re-distribution insulating layers RD2 are provided, is illustrated, but embodiments are not limited to this example. For example, the second re-distribution layer RD2 may include two, or four or more, second re-distribution insulating layers RD2, in which the second re-distribution patterns RP2 are provided.

Some of the first and second re-distribution patterns RP1 and RP2 may be used to deliver a power, and others of the first and second re-distribution patterns RP1 and RP2 may be used to deliver signals. The first and second re-distribution patterns RP1 and RP2 may include power vias and signal vias.

A mold via MV may be provided to penetrate the mold layer MD and electrically connect the first re-distribution layer RD1 to the second re-distribution layer RD2. The mold via MV may be disposed on the top surface of the first re-distribution layer RD1 and may be in contact with the bottom surface of the second re-distribution layer RD2. The mold via MV may be electrically connected to one of the uppermost first re-distribution patterns RP1 and one of the lowermost second re-distribution patterns RP2 corresponding thereto. In an embodiment, a plurality of mold vias MV may be provided. The mold via MV may be horizontally spaced apart from the first semiconductor chip CH1, on which the second semiconductor chip CH2 is stacked. The mold via MV may be disposed to enclose the first and second semiconductor chips CH1 and CH2, when viewed in a plan view. The mold via MV may be a metal pillar and may be formed of or include, for example, copper (Cu).

Figure 3:
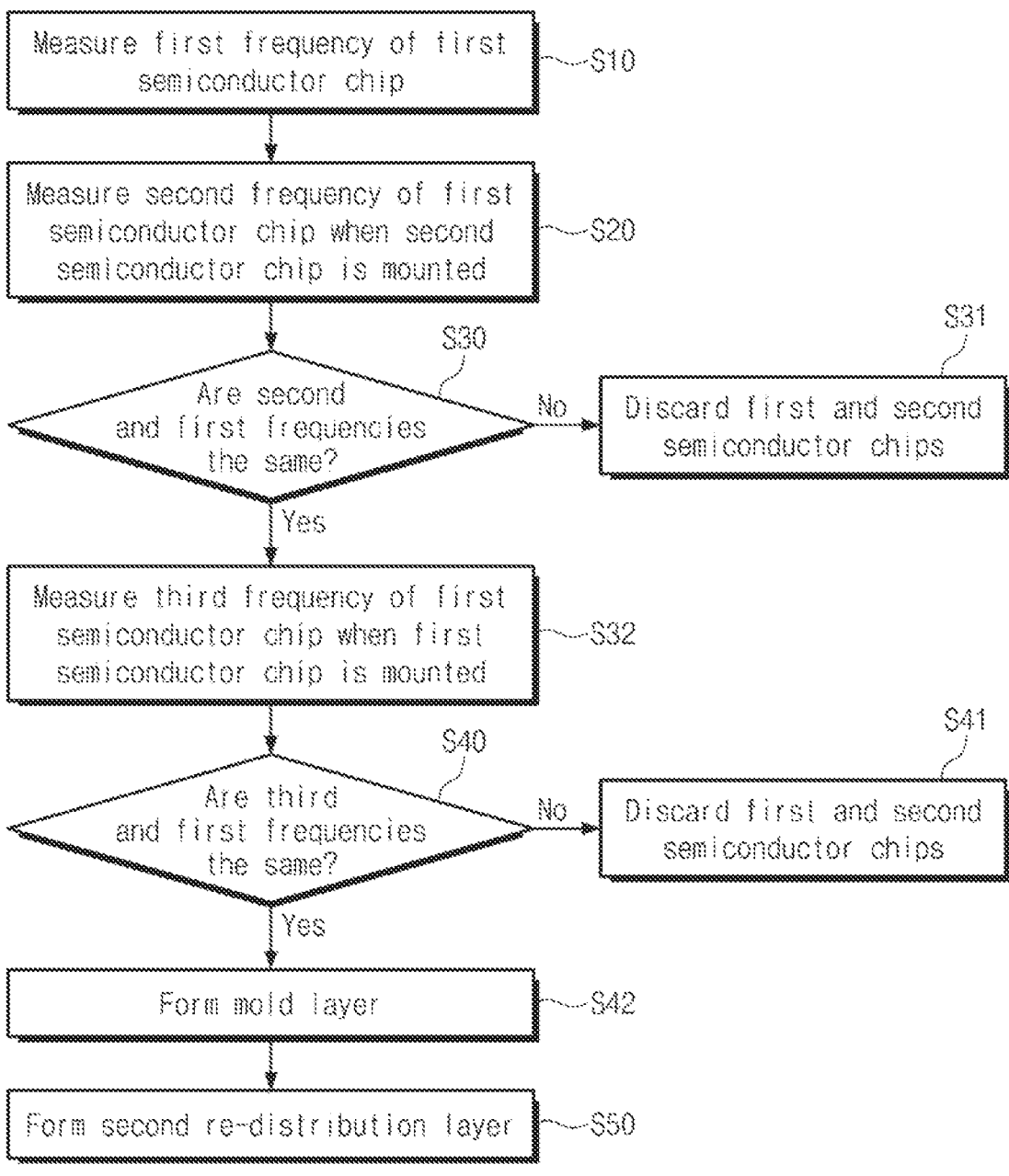
FIG. 3 is a flow chart illustrating a method of fabricating the semiconductor package of FIG. 2.

FIG. 3 is a flow chart illustrating a method of fabricating the semiconductor package of FIG. 2. FIGS. 4A to 4E are sectional views illustrating a process of fabricating the semiconductor package of FIG. 2.

Figure 4A:
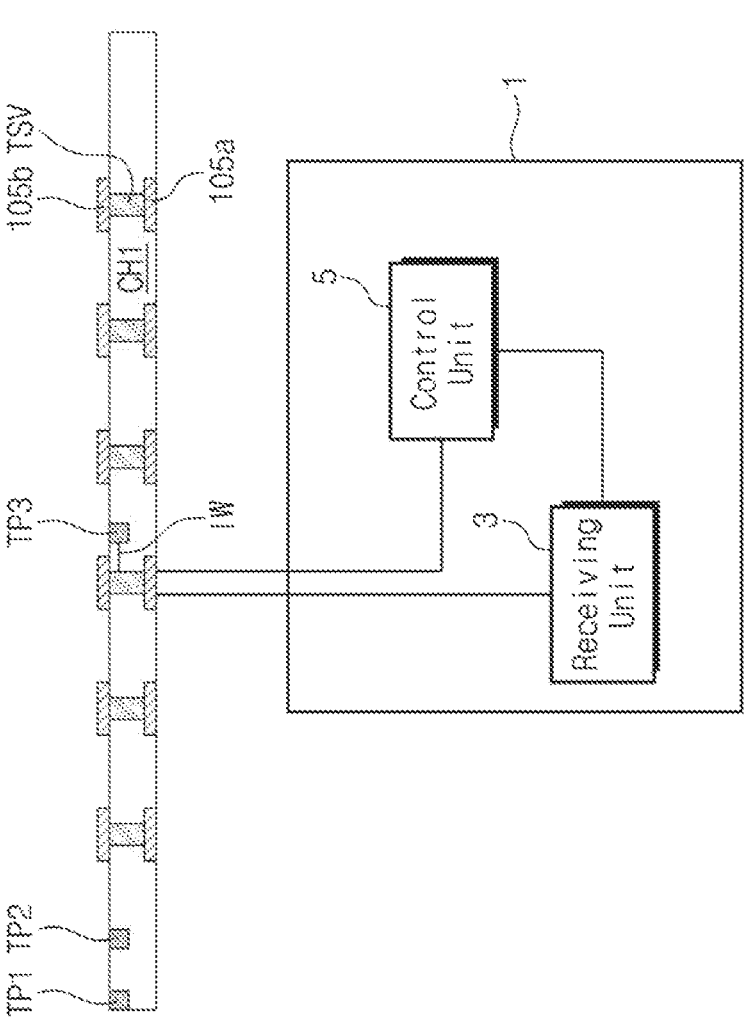

Referring to FIGS. 3 and 4A, a first frequency may be measured when a stress is exerted on the first semiconductor chip CH1 (S10). This measurement may be performed by an external device 1 electrically connected to the first semiconductor chip CH1.

The external device 1 may be electrically connected to at least one of the test patterns TP1 to TP3.

The external device 1 may be electrically connected to the first chip pad 105a of the first semiconductor chip CH1 connected to the penetration via TSV, as shown in FIG. 2. The external device 1 may measure the frequency, which occurs when the stress is exerted on the first semiconductor chip CH1, through the test pattern.

The external device 1 may include a receiving unit 3 and a control unit 5. The receiving unit 3 may be electrically connected to the first semiconductor chip CH1 and may receive information for measuring a frequency, which occurs when a stress is exerted on the first semiconductor chip CH1, from the test pattern TP. The control unit 5 may receive the information from the receiving unit 3 and may calculate the frequency, which occurs when the stress is exerted on the first semiconductor chip CH1. According to another embodiment, the control unit 5 may be electrically connected to the first semiconductor chip CH1 to obtain information for measuring a frequency, which occurs when a stress is exerted on the first semiconductor chip CH1.

Figure 4B:
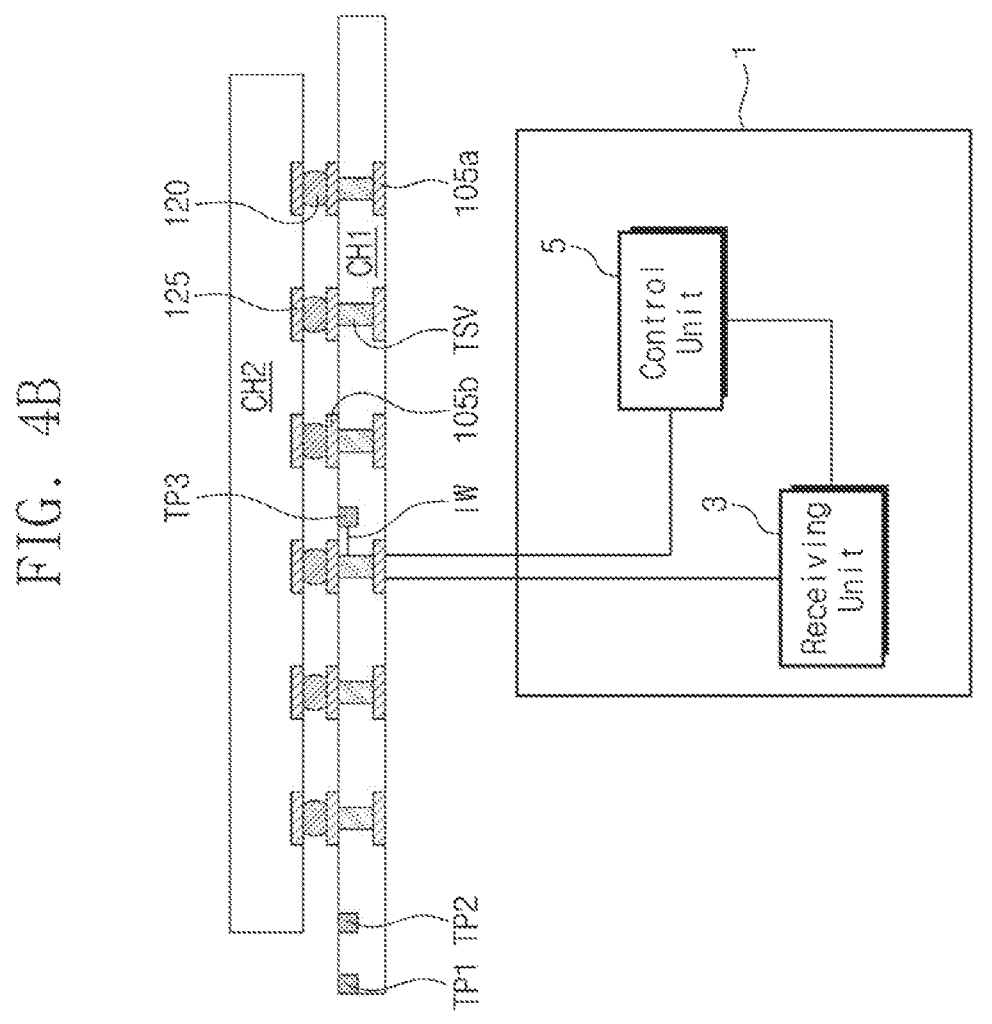

Referring to FIGS. 3 and 4B, the second semiconductor chip CH2 may be stacked on the first semiconductor chip CH1. A second frequency may be measured under a stress, which is exerted on the first semiconductor chip CH1 when the second semiconductor chip CH2 is stacked on the top surface of the first semiconductor chip CH1 (S20). This measurement may be performed by an external device 1 electrically connected to the first semiconductor chip CH1.

Whether the second frequency is equal to the first frequency may be measured (S30). Since, as described above, the second test pattern TP2 is disposed in a region of the upper portion of the first semiconductor chip CH1 which vertically overlaps with an end portion of the second semiconductor chip CH2 in a plan view, it may be possible to more effectively measure a frequency, which is caused by a stress exerted on the first semiconductor chip CH1 when the second semiconductor chip CH2 is mounted.

When the second frequency is different from the first frequency, it may indicate a failure, and in this case, the first and second semiconductor chips CH1 and CH2 may be discarded (S31). For example, if the second frequency is different from the first frequency, it may be determined that a failure occurs when the second semiconductor chip CH2 is mounted the first semiconductor chip CH1, and the first and second semiconductor chips CH1 and CH2 may be discarded.

Figure 4C:
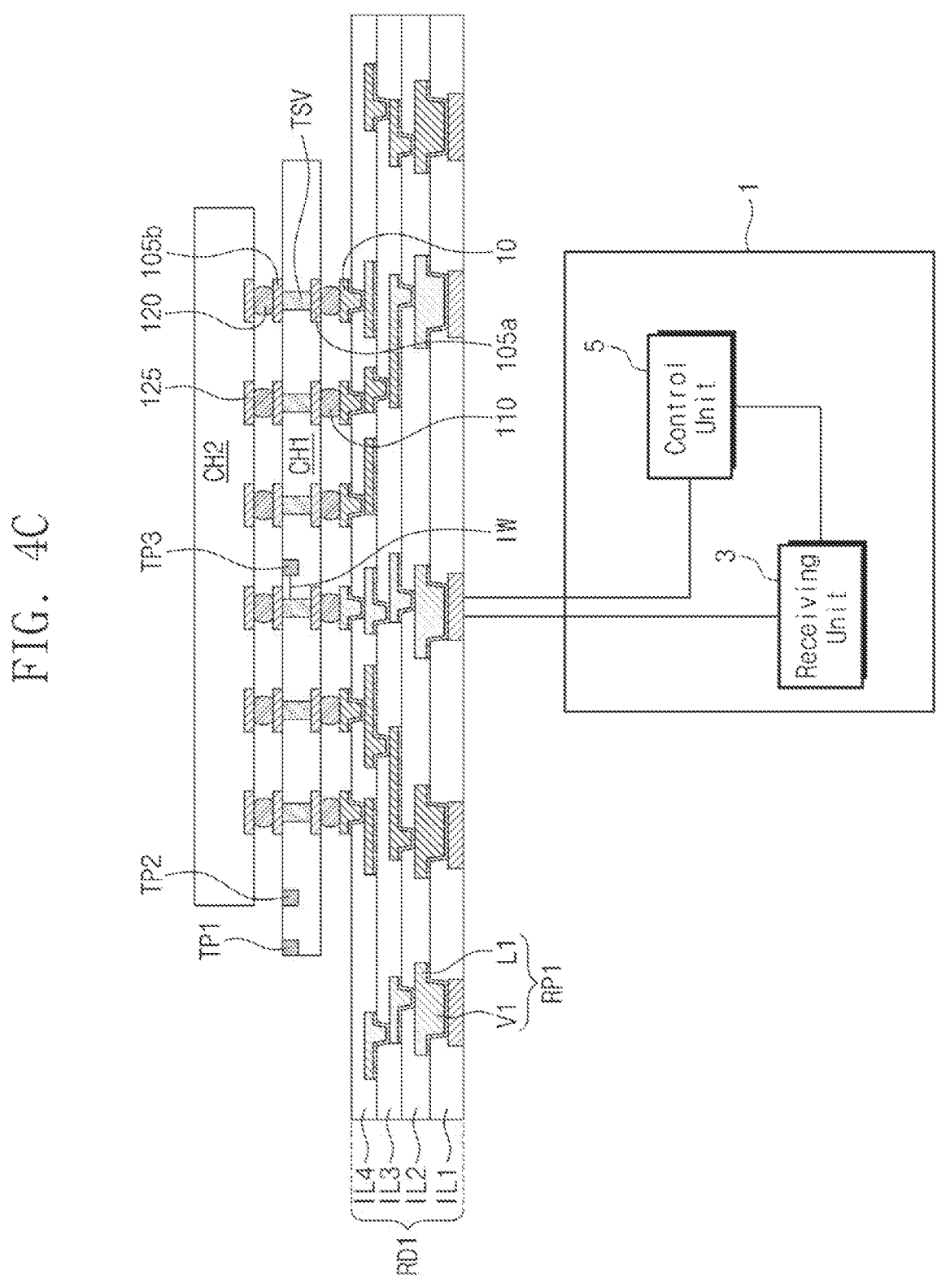

By contrast, when the second frequency is equal to the first frequency, it may be determined that there is no problem, and a subsequent process may be performed, as shown in FIG. 4C. For example, the first semiconductor chip CH1, on the top surface of which the second semiconductor chip CH2 is stacked, may be stacked on the top surface of the first re-distribution layer. A third frequency may be measured under a stress, which is exerted on the first semiconductor chip CH1 when the first semiconductor chip CH1 is stacked on the top surface of the first re-distribution layer (S32).

Whether the third frequency is equal to the first frequency may be measured (S40).

When the third frequency is different from the first frequency, it may indicate a failure, and in this case, the first and second semiconductor chips CH1 and CH2 may be discarded (S41). For example, when the third frequency is different from the first frequency, it may be determined that a failure occurs when the stack of the first and second semiconductor chips CH1 and CH2 is mounted on the first re-distribution layer RD1, and the first and second semiconductor chips CH1 and CH2 may be discarded.

Figure 4D:
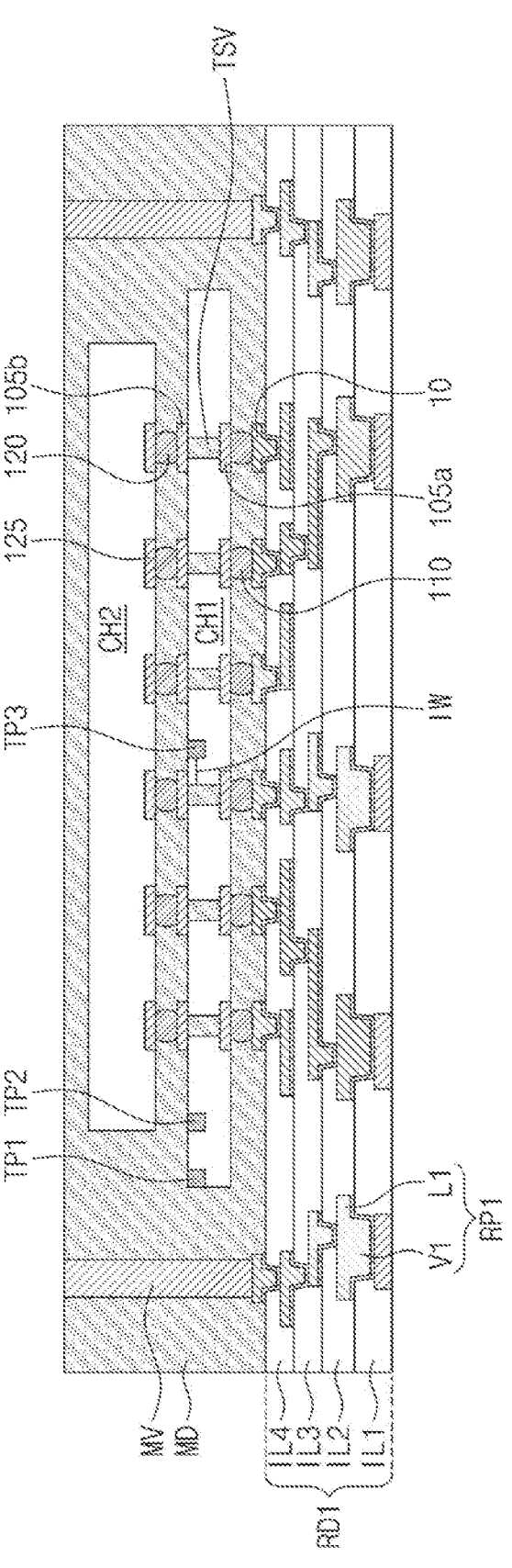

By contrast, when the third frequency is equal to the first frequency, it may be determined that there is no problem, and a subsequent process may be performed, as shown in FIG. 4D. For example, the mold layer MD may be formed to cover the first and second semiconductor chips CH1 and CH2 and the first re-distribution layer RD1 (S42). Furthermore, the mold via MV may be formed to penetrate the mold layer MD.

Here, the formation of the mold via MV may include forming a penetration hole in the mold layer MD after the formation of the mold layer MD and filling the penetration hole with a conductive material. According to another embodiment, the mold via MV may be disposed on the first re-distribution layer RD1, before the formation of the mold layer MD, and then, the mold layer MD may be formed to cover the top surface of the first re-distribution layer RD1 and the mold via MV.

Figure 4E:
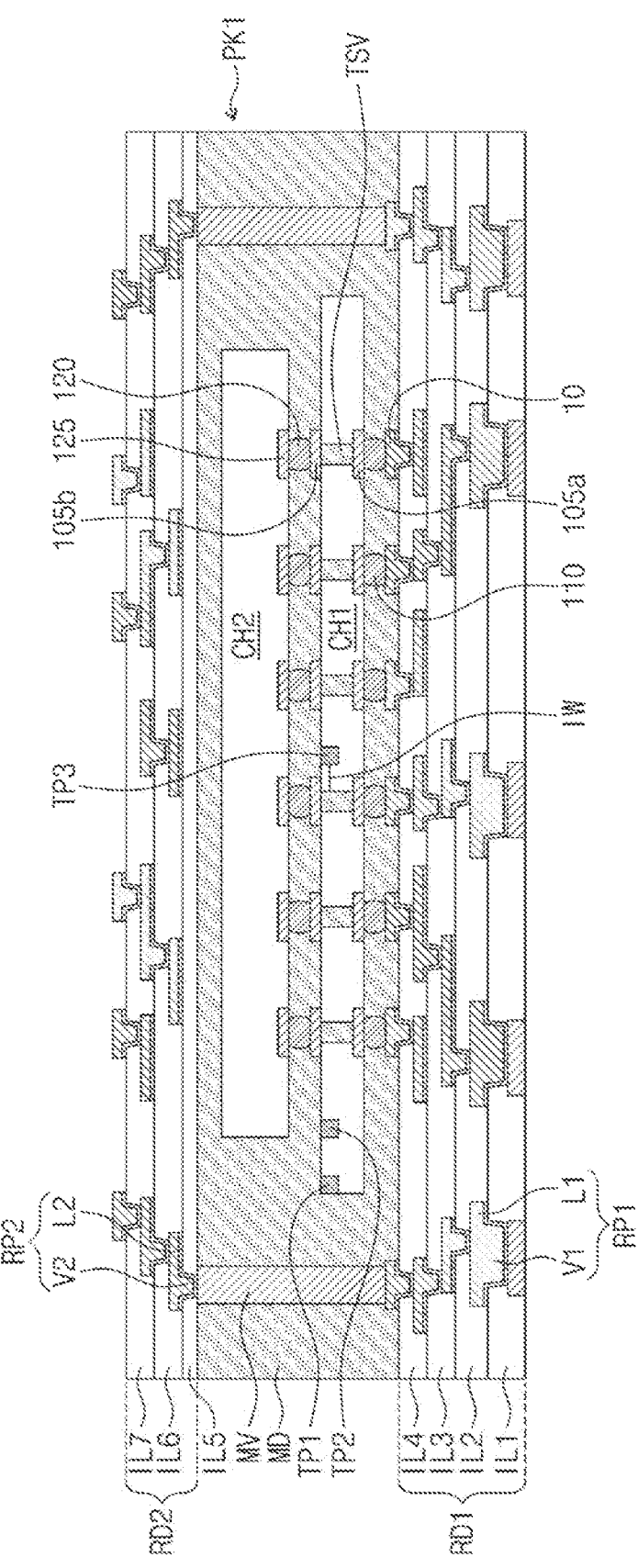

Thereafter, referring to FIGS. 3 and 4E, the second re-distribution layer RD2 may be formed on the mold layer MD (S50).

Next, referring back to FIG. 2, the outer connection terminals OSB may be bonded to the bottom surface of the first re-distribution layer RD1. As a result, the semiconductor package PK1 may be fabricated.

Figure 5:
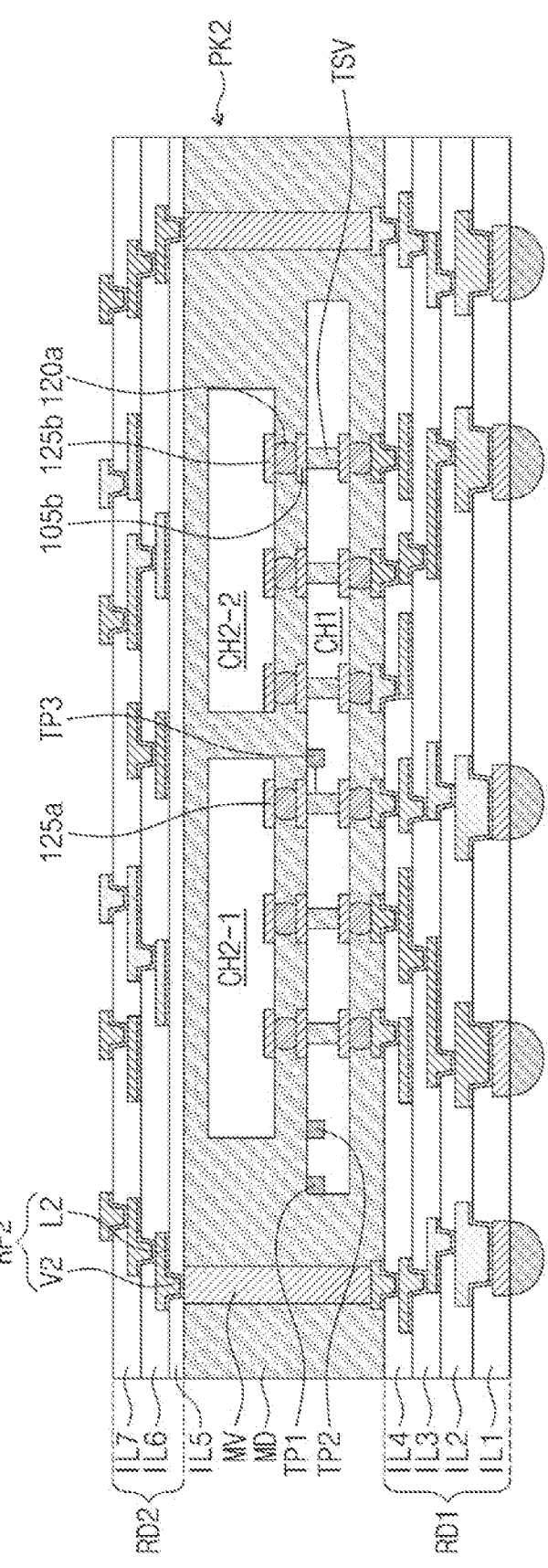
FIG. 5 is a sectional view illustrating a semiconductor package according to an embodiment.

FIG. 5 is a sectional view illustrating a semiconductor package according to an embodiment.

A semiconductor package PK2 according to the embodiment may include a plurality of second semiconductor chips, and except for this difference, it may be substantially the same as the semiconductor package PK1 described with reference to FIGS. 1 to 4F. Thus, for concise description, an element described with reference to FIGS. 1 to 4F may be identified by the same reference number without repeating an overlapping description thereof.

A plurality of second semiconductor chips CH2, which are memory chips, may be provided. The second semiconductor chips CH2 may be placed on the first semiconductor chip CH1. For example, as shown in FIG. 5, the second semiconductor chips CH2 may include a (2-1)-th semiconductor chip CH2-1 and a (2-2)-th semiconductor chip CH2-2.

In this case, for connection to the first semiconductor chip CH1, the (2-1)-th semiconductor chip CH2-1 may include a first inner chip pad 125a, and the (2-2)-th semiconductor chip CH2-2 may include a second inner chip pad 125b. The inner chip pads 125a and 125b, which are respectively provided in the second semiconductor chips CH2-1 and CH2-2, may be connected to the first semiconductor chip CH1 through second inner connection members 120a. The second inner connection members 120a may include solder balls, conductive bumps, and/or conductive pillars. The second inner connection members 120a may be formed of or include at least one of tin, lead, silver, copper, nickel, or gold.

Figure 6:
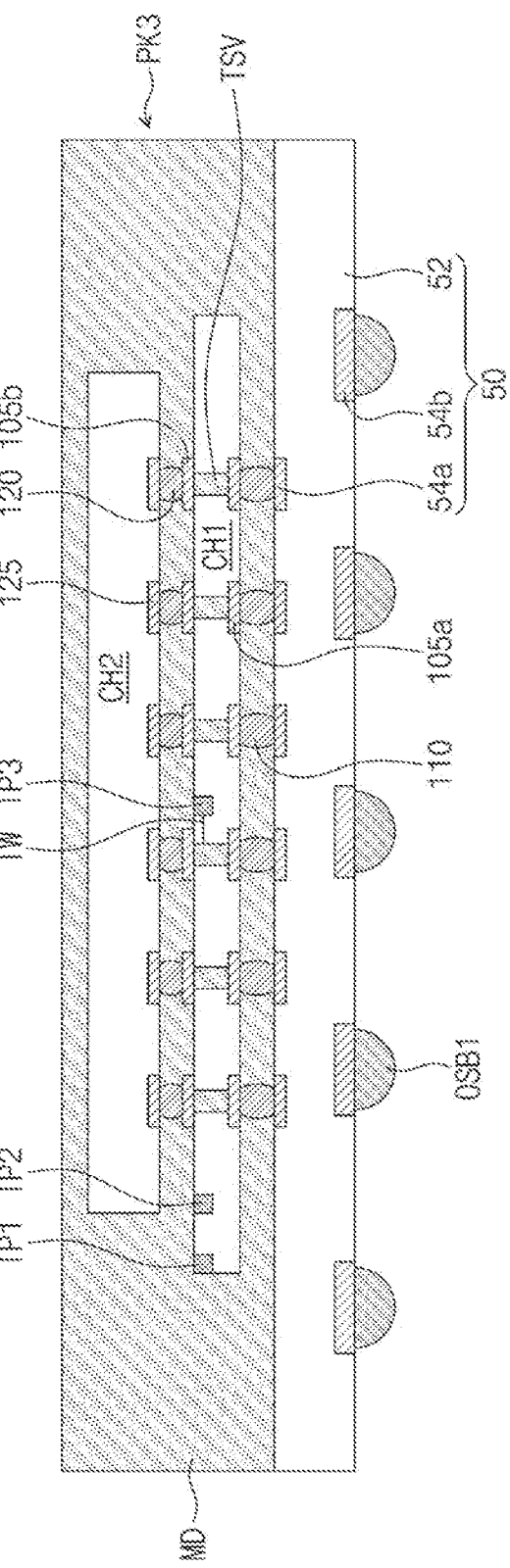
FIG. 6 is a sectional view illustrating a semiconductor package according to an embodiment.

FIG. 6 is a sectional view illustrating a semiconductor package according to an embodiment.

A semiconductor package PK3 according to the embodiment may include a package substrate, but not the first and second re-distribution layers RD1 and RD2 of FIG. 2, and except for this difference, it may be substantially the same as the semiconductor package PK1 described with reference to FIGS. 1 and 2. Thus, for concise description, an element described with reference to FIGS. 1 and 2 may be identified by the same reference number without repeating an overlapping description thereof.

A package substrate 50 may include a substrate base 52, upper substrate pads 54a, and lower substrate pads 54b.

The substrate base 52 may be formed of at least one material that is selected from the group consisting of phenolic resin, epoxy resin, and polyimide. For example, the substrate base 52 may be formed of at least material that is selected from the group consisting of tetrafunctional epoxy, polyphenylene ether, epoxy/polyphenylene oxide, bismaleimide triazine (BT), thermount, cyanate ester, polyimide, and liquid crystal polymer.

The upper substrate pads 54a may be disposed near a top surface of the substrate base 52. In an embodiment, the upper substrate pads 54a may be exposed to the outside of the substrate base 52 near the top surface of the substrate base 52. The upper surface of the upper substrate pads 54a and the upper surface of the substrate base 52 may be coplanar.

The upper and lower substrate pads 54a and 54b may be formed of or include at least one of metallic materials.

The lower substrate pads 54b may be disposed near a bottom surface of the substrate base 52. In an embodiment, the lower substrate pads 54b may be exposed to the outside of the substrate base 52 near the bottom surface of the substrate base 52. The lower surface of the lower substrate pads 54b and the lower surface of the substrate base 52 may be coplanar.

The first semiconductor chip CH1 and the second semiconductor chip CH2 may be disposed on the package substrate 50.

Outer connection terminals OSB1 may be bonded to a bottom portion of the package substrate 50.

According to embodiments, a semiconductor package may include test pattern, which are respectively formed in corner and center portions of a first chip and in a portion of the first chip overlapping a second chip in a vertical direction. Thus, it may be possible to measure a change of frequency, which is caused by a stress exerted on the first chip in each step of a fabrication process. Accordingly, it may be possible to examine whether or not a failure occurs in each step of the fabrication process and thereby to improve reliability of the semiconductor package.

While example embodiments have been particularly shown and described, it will be understood by one of ordinary skill in the art that variations in form and detail may be made therein without departing from the spirit and scope of the attached claims and their equivalents.

What is claimed is:

1. A semiconductor package, comprising:
a first semiconductor chip having a rectangular shape; and
a second semiconductor chip on the first semiconductor chip,
wherein the first semiconductor chip comprises a plurality of test patterns,
wherein each test pattern of the plurality of test patterns is configured to be used to measure a frequency based on stress exerted on the first semiconductor chip,
wherein a width of the first semiconductor chip is greater than a width of the second semiconductor chip in a horizontal direction,
wherein the plurality of test patterns comprise a first test pattern contacting a corner of the first semiconductor chip in which two sides of the rectangular shape of the first semiconductor chip intersect,
wherein a second test pattern included in a region of an upper portion of the first semiconductor chip overlapping with an end portion of the second semiconductor chip in a vertical direction, and
wherein a third test pattern included in a central region of the upper portion of the first semiconductor chip.

2. The semiconductor package of claim 1, wherein at least one test pattern of the plurality of test patterns is included in the upper portion of the first semiconductor chip.

3. The semiconductor package of claim 1, wherein the first test pattern, the second test pattern, and the third test pattern are along a diagonal line connecting opposite corners of the first semiconductor chip.

4. The semiconductor package of claim 1, wherein at least one test pattern of the plurality of test patterns comprises a ring oscillator.

5. The semiconductor package of claim 1, further comprising:
a first re-distribution layer below the first semiconductor chip in a vertical direction; and
a mold layer on the first semiconductor chip, the second semiconductor chip, and the first re-distribution layer.

6. The semiconductor package of claim 5, further comprising:
a mold via penetrating the mold layer and connected to the first re-distribution layer; and
a second re-distribution layer on the mold layer.

7. The semiconductor package of claim 1, wherein the first semiconductor chip is a logic chip, and
wherein the second semiconductor chip is a memory chip.

8. A semiconductor package, comprising:
a first re-distribution layer;
a first semiconductor chip on the first re-distribution layer, the first semiconductor chip comprising a plurality of test patterns;
a second semiconductor chip on the first semiconductor chip, a width of the second semiconductor chip being smaller than a width of the first semiconductor chip in a horizontal direction; and
a second re-distribution layer on the second semiconductor chip,
wherein the first semiconductor chip is configured to measure a frequency based on stress being exerted on the first semiconductor chip.

9. The semiconductor package of claim 8, wherein the plurality of test patterns comprise:
a first test pattern adjacent to a corner of the first semiconductor chip;
a second test pattern included in a region of an upper portion of the first semiconductor chip overlapping with an end portion of the second semiconductor chip in a vertical direction; and
a third test pattern in a central region of the upper portion of the first semiconductor chip.

10. The semiconductor package of claim 9, wherein the first test pattern, the second test pattern, and the third test pattern are along a diagonal line connecting opposite corners of the first semiconductor chip.

11. The semiconductor package of claim 8, further comprising:
a mold layer on the first semiconductor chip, the second semiconductor chip, and the first re-distribution layer.

12. The semiconductor package of claim 11, further comprising:
a mold via penetrating the mold layer and connected to the first re-distribution layer,
wherein the second re-distribution layer is on the mold layer.

13. A semiconductor package, comprising:
a first re-distribution layer;
a first semiconductor chip on the first re-distribution layer, the first semiconductor chip comprising a plurality of test patterns;
a second semiconductor chip on the first semiconductor chip, a width of the second semiconductor chip being smaller than a width of the first semiconductor chip;
a mold layer on the first semiconductor chip and the second semiconductor chip;
a mold via penetrating the mold layer; and
a second re-distribution layer on the mold layer,
wherein each of the plurality of test patterns is configured to be used to measure a frequency that is caused by stress applied to the first semiconductor chip,
wherein the first semiconductor chip further comprises a penetration via connected to each of the plurality of test patterns, and
wherein the plurality of test patterns comprise a first test pattern adjacent to a corner of the first semiconductor chip, a second test pattern included in a region of an upper portion of the first semiconductor chip overlapping with an end portion of the second semiconductor chip in a vertical direction, and a third test pattern in a central region of the upper portion of the first semiconductor chip.

14. The semiconductor package of claim 13, wherein the first test pattern, the second test pattern, and the third test pattern are along a diagonal line connecting opposite corners of the first semiconductor chip.

15. The semiconductor package of claim 13, wherein the first semiconductor chip is a logic chip, and wherein the second semiconductor chip is a memory chip.

16. The semiconductor package of claim 13, wherein the plurality of test patterns comprises a ring oscillator.

17. The semiconductor package of claim 13, wherein the second semiconductor chip comprises a plurality of second semiconductor chips.

* * * * *